United States Patent [19]
Clark

[11] Patent Number: 5,455,788
[45] Date of Patent: Oct. 3, 1995

[54] SRAM TO ROM PROGRAMMING CONNECTIONS TO AVOID PARASITIC DEVICES AND ELECTRICAL OVERSTRESS SENSITIVITY

[75] Inventor: Rodney L. Clark, Burnsville, Minn.

[73] Assignee: Honeywell Inc., Minneapolis, Minn.

[21] Appl. No.: 111,360

[22] Filed: Aug. 24, 1993

[51] Int. Cl.$^6$ .............................. G11C 17/00; G11C 5/06
[52] U.S. Cl. .......................... 365/156; 365/94; 365/103; 365/104
[58] Field of Search .............................. 365/95, 96, 156, 365/225.7, 103, 104; 257/390

[56] References Cited

U.S. PATENT DOCUMENTS

| | | | |
|---|---|---|---|
| 4,584,669 | 2/1986 | Moynihan et al. | 365/95 |
| 4,855,803 | 8/1989 | Azumai et al. | 365/63 X |
| 4,995,004 | 2/1991 | Lee | 365/190 X |
| 5,018,102 | 5/1991 | Houston | 365/95 |

Primary Examiner—Joseph A. Popek
Assistant Examiner—Tan Nguyen
Attorney, Agent, or Firm—Gregory A. Bruns

[57] ABSTRACT

Programming connections convert a partially fabricated six transistor SRAM cell to a ROM cell while avoiding parasitic devices and electrical overstress sensitivity but providing an active pull-up device for the bit line that is to be driven high.

7 Claims, 2 Drawing Sheets

SRAM TO ROM PROGRAMMING CONNECTIONS TO AVOID PARASITIC DEVICES AND ELECTRICAL OVERSTRESS SENSITIVITY

BACKGROUND OF THE INVENTION

The present invention relates to fixed information content memories often referred to as read only memories (ROM) and more particularly to the programming of the underlying layers of random access memories (RAM) to perform as ROMS.

In certain situations it is desirable to be able to convert an existing static random access memory (SRAM) into a ROM using common underlayers. It is recognized that a memory cell initially designed as a ROM may be expected to be a simpler device than will be obtained when an SRAM is converted to a ROM. However there are situations where the ability to convert is extremely advantageous, for example, where the underlayer design of the SRAM has already satisfactorily passed various tests or has been approved for certain applications. An entirely newly designed ROM would have to be subjected to similar tests and possible design modifications and go through the approval process for the particular application. In addition, the conversion capability would allow a common inventory of partially fabricated wafers that include the underlayers to be utilized as either SRAMs or ROMs.

FIG. 1 is a schematic diagram illustrating one example of interconnections which can be used to convert the underlying layers of an SRAM to a ROM memory cell 6. M1 and M3 are P-channel transistors and M2 and M4 are N-channel transistors. The circuit is essentially an SRAM six transistor memory cell with the connection between the drains of M1 and M2 connected to a positive voltage, $V_{DD}$, or a ground reference voltage, $V_{SS}$, and the connection between M3 and M4 connected to either a positive voltage or a ground voltage. The specific connections are shown by the "1" or "0" designations in FIG. 1.

When the connections of FIG. 1 are made as shown for programming memory cell 6 as a "zero", transistor M1 has a positive voltage $V_{DD}$ and a ground voltage $V_{SS}$ across its source and drain connections respectively. Likewise transistor M4 has $V_{DD}$ and $V_{SS}$ across its source and drain, respectively. This has the potential of increasing the electrical overstress sensitivity of transistors M1 and M4. In addition transistor M1 now makes up a parasitic PNP structure connected directly across $V_{DD}$ and $V_{SS}$. Also transistor M4 makes up a parasitic NPN structure connected directly across $V_{DD}$ and $V_{SS}$.

FIG. 2 is a schematic diagram illustrating another example of interconnections which can be used to convert the underlying layers of an SRAM to a ROM memory cell 8. M1 and M3 are P-channel transistors and M2 and M4 are N-channel transistors. The circuit is essentially an SRAM six transistor memory cell with the drains of P-channel devices M1 and M3 disconnected permanently. The programming of memory cell 8 of FIG. 2 is accomplished by connecting the drain of transistor M2 to $V_{SS}$ for a "zero" memory state or connecting the drain of transistor M4 to $V_{SS}$ for a "one" memory state. The specific connections are shown by the "1" or "0" designations in FIG. 2. A disadvantage of the programming connections shown in FIG. 2 is that there is no active pull-up on the bit line that is to be driven to a high state. For example, when the circuit of FIG. 2 is programmed as a "zero" the bit line connected to the drain of M4 through pass-transistor M6 is intended to be pulled high, but transistor M3 is not available to perform the pull-up function. This will likely result in a slower read access time which may not be acceptable in certain applications.

Thus a need exists for a programming arrangement for converting existing SRAM underlayers to ROMs that does not have the disadvantages of electrical overstress sensitivity and provides active pull-up for the bit line that is intended to be pulled high.

SUMMARY OF THE INVENTION

The present invention solves these and other needs by providing an interconnection arrangement for converting the underlying layers of a partially fabricated SRAM memory cell to a ROM memory cell. In a first aspect, interconnections are provided for a programming a conventional six transistor SRAM cell to a ROM cell while eliminating the direct connection of supply voltage across any transistor to avoid parasitic devices and electrical overstress sensitivity. In a second aspect, active pull-up is provided for the bit line that is to be pulled high.

DETAILED DESCRIPTION

Figure 1:
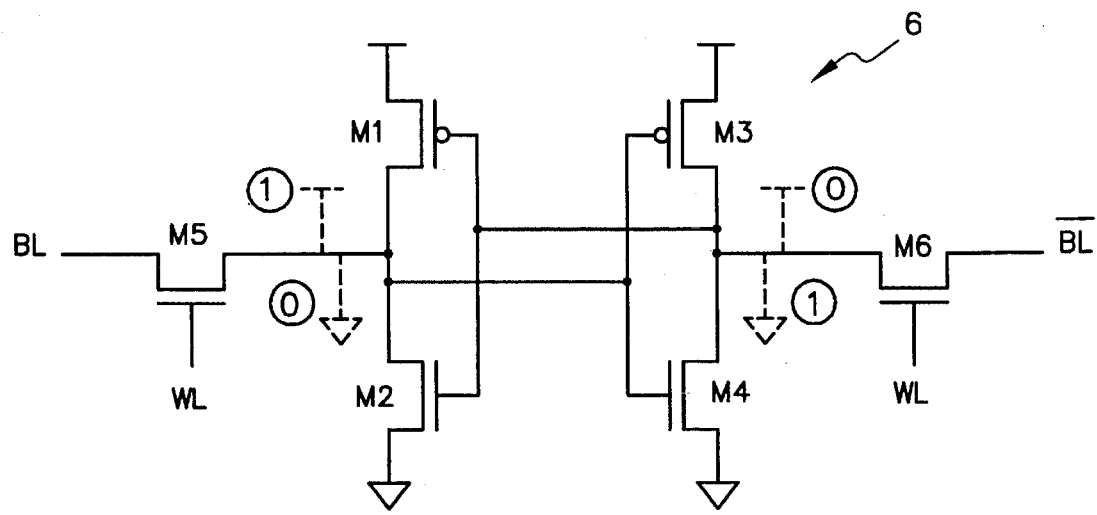
FIG. 1 is a circuit diagram illustrating one arrangement for programming an SRAM to a ROM.
Figure 2:
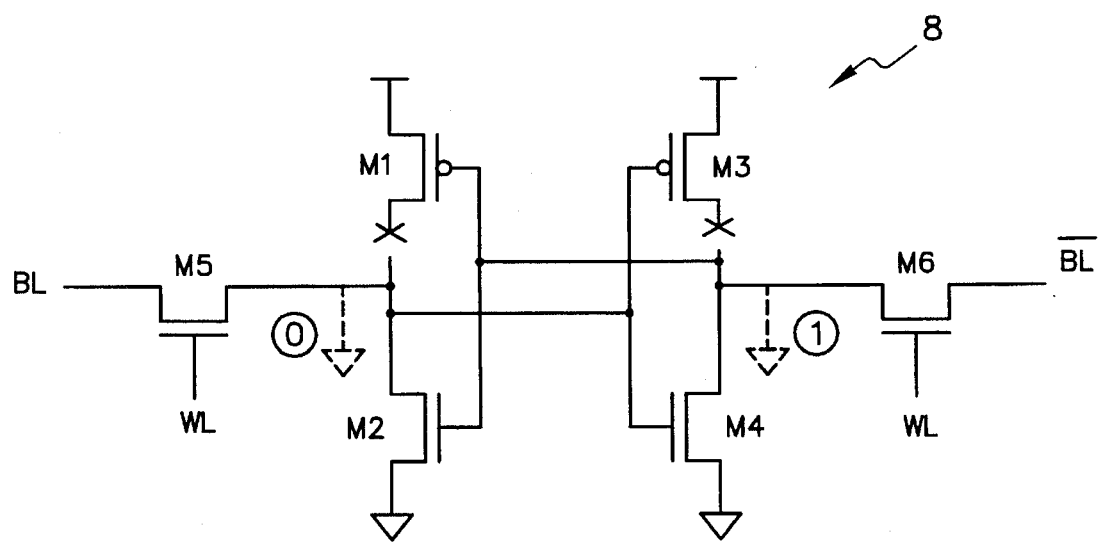
FIG. 2 is a circuit diagram illustrating a second interconnection arrangement for programming an SRAM to a ROM.

An interconnection arrangement for converting the underlayers of a six transistor SRAM cell into a ROM cell is shown in the drawings and generally designated 10. Cell 10 includes P-channel transistor M1 having source 51, drain 52 and gate 53 and N-channel transistor M2 having source 71, drain 72 and gate 73 connected as a first inverter 12. A positive voltage supply, $V_{DD}$, is connected to source 51 of M1, the drain 52 of M1 and drain 72 of M2 are connected together and the source 71 of M2 is connected to ground reference voltage, $V_{SS}$. A first active high bit line 14 is connected through transistor M5 to the connection between the drain 52 of M1 and drain 72 of M2. There is a first common gate connection 16 between M1 and M2. Cell 10 further includes P-channel transistor M3 having source 61, drain 62 and gate 63 and N-channel transistor M4 having source 81, drain 82 and gate 83 connected as a second inverter 20 with $V_{DD}$ connected to source 61 of M3. Drain 62 of M3 and drain 82 of M4 are connected together and source 81 of M4 is connected to $V_{SS}$. A second active low bit line 18 is connected through transistor M6 to the connection between drain 62 of M3 and drain 82 of M4. There is a second common gate connection 22 between M3 and M4. In order to program cell 10 of FIG. 3 as a "one", common gate connection 16 is connected to $V_{SS}$ causing M1 to be "on" and bit line 14 to be pulled to $V_{DD}$, while common gate connection 22 is connected to $V_{DD}$ causing M4 to be "on" and bit line 18 to be pulled to $V_{SS}$.

The gates of M5 and M6 are assumed to be tied to $V_{DD}$ and are in the "on" state for the following discussion.

In order to program cell 10 as a "zero", common gate connection 16 is connected to $V_{DD}$ causing M2 to be "on" and bit line 14 to be pulled to $V_{SS}$, while common gate connection 22 is connected to $V_{SS}$ causing M3 to be "on" and bit line 18 to be pulled to $V_{DD}$.

Figure 3:
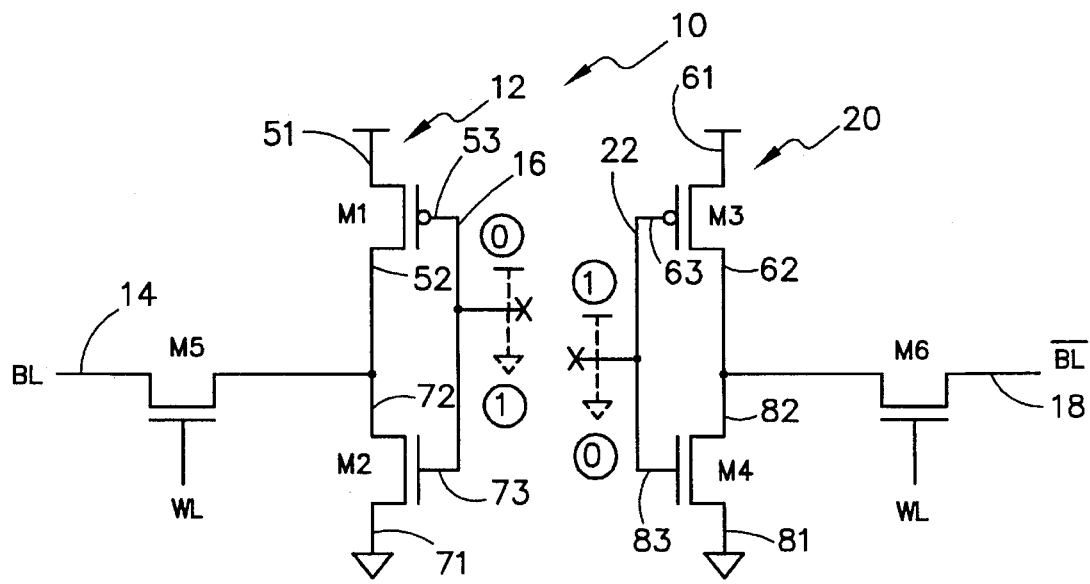
FIG. 3 is a circuit diagram illustrating the interconnection arrangement of the present invention.

Note that with the interconnections of FIG. 3, in no case is $V_{DD}$ connected directly to the drain of either of the N-channel transistors M2 or M4. In addition, in no case is $V_{SS}$ connected directly to either of the P-channel transistors M1 or M3.

Figure 4:
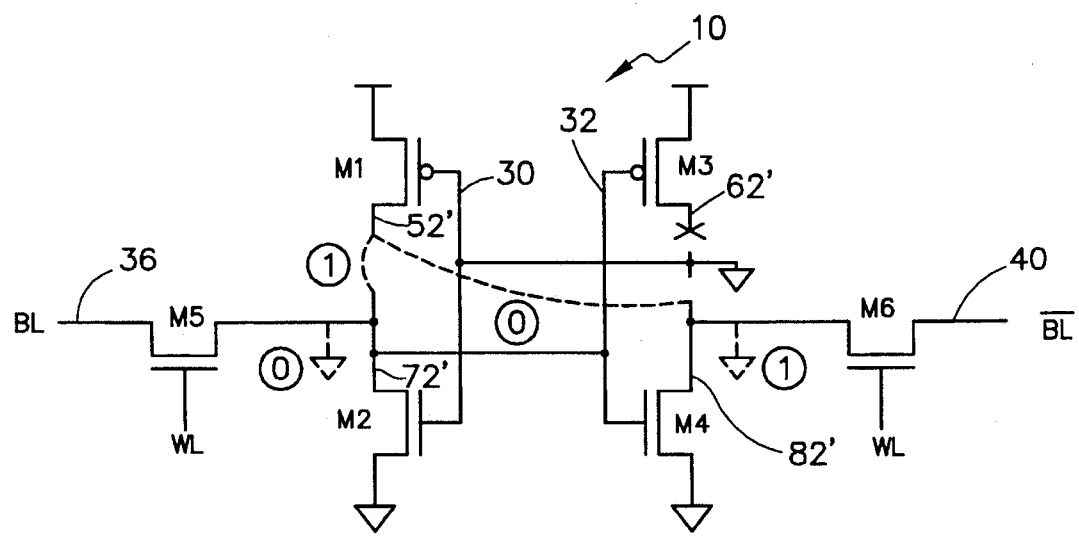
FIG. 4 is a circuit diagram of an alternative embodiment of the present invention.

An alternative embodiment of the present invention is shown in FIG. 4 where there is no connection between drain 62' of transistor M3 and the drain 82' of transistor M4. In addition common gate connection 30 of transistors M1 and M2 is connected to $V_{SS}$ and common gate connection 32 of transistor M3 and M4 is connected to drain 72' of transistor M2.

In order to program cell 10 of FIG. 4 to a "one", drain 52' of M1 is connected to drain 72' of M2 causing drain 72' to be pulled to $V_{DD}$ and bit line 36 to be pulled to $V_{DD}$ and drain 82' of M4 is connected to $V_{SS}$ causing bit line 40 to be pulled to $V_{SS}$. In order to program cell 10 of FIG. 4 as a "zero" drain 72' of M2 is connected to $V_{SS}$ causing bit line 36 to be pulled to $V_{SS}$ and drain 52' of M1 is connected to drain 82' of M4 causing drain 82' to be pulled to $V_{DD}$ and bit line 40 to be pulled to $V_{DD}$.

In the interconnection arrangement of FIG. 4 transistor M1 is used as an active pull-up device to pull the voltage of bit line 36 toward $V_{DD}$ when cell 10 is programmed as a "one". When cell 10 of FIG. 4 is programmed as a "zero" M1 is used as an active pull-up device to pull the voltage of bit line 40 toward $V_{DD}$. A further advantage of the interconnections of FIG. 4 is that in no case is $V_{DD}$ connected directly to the drain of either of the N-channel transistors M2 or M4. In addition, neither of the P-channel transistors M1 and M3 have $V_{SS}$ connected to their drain. Therefore no parasitic PNP or NPN transistors are generated using the interconnections of FIG. 4.

In FIG. 3 and FIG. 4 transistors M5 and M6 are shown as N-channel transistors, but could also be either P-channel transistors, full transmission gates or other type of gating devices. Also the configuration of the existing SRAM underlayer and available space may limit the ways in which interconnections for conversion can be implemented.

In accordance with the foregoing description, Applicant has developed an interconnection method that can be used to convert the underlayers of an existing SRAM cell into a ROM cell. Although specific embodiments of Applicant's invention have been shown and described for illustrative purposes, a number of variations will be apparent to those of ordinary skill in the relevant arts. It is not intended that coverage be limited to the disclosed embodiments, but only by the terms of the following claims.

I claim:

1. Programming arrangement for converting an existing partially fabricated SRAM cell to a ROM cell, said existing SRAM cell connected to a first voltage and a second voltage and said existing SRAM cell including first, second, third and fourth transistors, each said transistor having a first terminal a second terminal and a gate terminal, a first gating device connected to a first bit line and to said second terminal of said second transistor, a second gating device connected to a second bit line and to said second terminal of said fourth transistor, wherein said programming arrangement comprises:

a first common gate connection between said first transistor gate terminal and said second transistor gate terminal;

a second common gate connection between said third transistor gate terminal and said fourth transistor gate terminal;

interconnection means for permanently programming said partially fabricated SRAM memory cell to a first memory state or to a second memory state with at least said first common gate connection or said second common gate connection permanently connected to said second voltage, wherein:

a first voltage differential between said first terminal and said second terminal of said first transistor is less than the difference between said first voltage and said second voltage;

a second voltage differential between said first terminal and said second terminal of said second transistor is less than the difference between said first voltage and said second voltage;

a third voltage differential between said first terminal and said second terminal of said third transistor is less than the difference between said first voltage and said second voltage; and a fourth voltage differential between said first terminal and said second terminal of said fourth transistor is less than the difference between said first voltage and said second voltage.

2. Programming arrangement of claim 1 wherein said first common gate connection is connected to a said second voltage and said second common gate connection is connected to said first voltage when said ROM cell is programmed to a first memory state.

3. Programming arrangement of claim 2 wherein said first voltage is a positive voltage and said second voltage is a ground reference voltage.

4. Programming arrangement of claim 1 wherein said first common gate connection is connected to said second voltage when said cell is programmed to said first or said second memory state, and said first transistor second terminal is connected to said second transistor second terminal and said fourth transistor second terminal is connected to said second voltage when said cell is programmed to said first memory state, and said first transistor second terminal is connected to said fourth transistor second terminal and said second transistor second terminal is connected to said second voltage when said cell is programmed to a second memory state.

5. Programming arrangement for converting an existing partially fabricated SRAM cell to a ROM cell, said existing SRAM cell including first, second, third and fourth transistors, each said transistor having a first terminal a second terminal and a gate terminal, said first transistor and said second transistor connected as a first inverter, said third transistor and said fourth transistor connected as a second inverter, said first inverter connected between a first voltage and a second voltage, said second inverter connected between said first voltage and said second voltage, a first gating device connected to a first bit line and to said second terminal of said second transistor, a second gating device connected to a second bit line and to said second terminal of said fourth transistor, wherein said programming arrangement comprises:

a first common gate connection to said first inverter, said first common gate connection connected to said first voltage when said cell is programmed to a first memory state, and to said second voltage when said cell is programmed to a second memory state, said first common gate connection remaining unconnected from said second terminal of said fourth transistor; and a second common gate connection to said second inverter, said second common gate connection connected to said second voltage when said cell is programmed to said first memory state, and to said first voltage when said cell is programmed to a second memory state, said second common gate connection remaining unconnected from said second terminal of said second transistor.

6. Programming arrangement for converting an existing partially fabricated SRAM cell to a ROM cell, said existing SRAM cell adapted for connection to a first voltage and a second voltage and said existing SRAM cell including first, second, third and fourth transistors, each said transistor having a first terminal a second terminal and a gate terminal, a first gating device connected to a first bit line and to said second terminal of said second transistor, a second gating device connected to a second bit line and to said second terminal of said fourth transistor, wherein said programming arrangement comprises:

no connection to said second terminal of said third transistor;

a first common gate connection between said first transistor gate terminal and said second transistor gate terminal, said first common gate connection connected to said second voltage;

said first transistor second terminal connected to said second transistor second terminal and said fourth transistor second terminal connected to said second voltage when said cell is programmed to a first memory state; and said first transistor second terminal connected to said fourth transistor second terminal and said second transistor second terminal connected to said second voltage when said memory cell is programmed to a second memory state.

7. Programming arrangement of claim 6 wherein said first voltage is a positive voltage and said second voltage is a ground reference voltage.

* * * * *